United States Patent
Bian

(10) Patent No.: US 7,790,618 B2
(45) Date of Patent: Sep. 7, 2010

(54) SELECTIVE SLURRY FOR CHEMICAL MECHANICAL POLISHING

(75) Inventor: Jinru Bian, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 11/019,882

(22) Filed: Dec. 22, 2004

(65) Prior Publication Data

US 2006/0131275 A1 Jun. 22, 2006

(51) Int. Cl.
*H01L 21/302* (2006.01)

(52) U.S. Cl. ............... 438/691; 252/79.1; 252/79.2; 252/79.3; 252/79.4; 438/692; 438/698; 438/700

(58) Field of Classification Search ....... 252/79.1–79.4; 438/692
See application file for complete search history.

(56) References Cited

U.S. PATENT DOCUMENTS

| | | | | |
|---|---|---|---|---|
| 5,575,837 A | * | 11/1996 | Kodama et al. | ............. 106/3 |
| 5,916,855 A | | 6/1999 | Avanzino et al. | |
| 6,027,554 A | | 2/2000 | Kodama et al. | |
| 6,270,393 B1 | | 8/2001 | Kubota et al. | |
| 6,302,209 B1 | * | 10/2001 | Thompson et al. | ........ 166/305.1 |
| 6,416,685 B1 | * | 7/2002 | Zhang et al. | ............... 252/79.1 |
| 6,436,834 B1 | * | 8/2002 | Lee et al. | ............... 438/693 |
| 6,447,695 B1 | | 9/2002 | Motonari et al. | |
| 6,475,069 B1 | * | 11/2002 | Thomas et al. | ............... 451/57 |
| 6,503,418 B2 | | 1/2003 | Sahota et al. | |
| 6,530,968 B2 | | 3/2003 | Tsuchiya et al. | |
| 6,569,349 B1 | * | 5/2003 | Wang et al. | ............... 252/79.1 |
| 6,607,424 B1 | | 8/2003 | Costas et al. | |
| 2001/0008828 A1 | | 7/2001 | Uchikura et al. | |
| 2002/0017630 A1 | | 2/2002 | Uchida et al. | |
| 2002/0098701 A1 | | 7/2002 | Hasegawa | |
| 2002/0189169 A1 | | 12/2002 | Costas et al. | |
| 2003/0006396 A1 | | 1/2003 | Wang et al. | |
| 2003/0061766 A1 | | 4/2003 | Vogt et al. | |
| 2003/0116445 A1 | | 6/2003 | Sun et al. | |
| 2003/0162399 A1 | | 8/2003 | Singh | |
| 2003/0181345 A1 | | 9/2003 | Bian | |
| 2003/0219982 A1 | | 11/2003 | Kurata et al. | |
| 2004/0115944 A1 | | 6/2004 | Matsui | |
| 2004/0148867 A1 | * | 8/2004 | Matsumi | ............... 51/298 |
| 2005/0108949 A1 | | 5/2005 | Matsuda et al. | |

FOREIGN PATENT DOCUMENTS

| | | | |
|---|---|---|---|
| EP | 1 096 556 A1 | | 5/2001 |
| EP | 1150341 A1 | * | 10/2001 |
| EP | 1 205 965 A1 | | 5/2002 |
| WO | WO 03/072670 A1 | | 9/2003 |

* cited by examiner

*Primary Examiner*—Nadine G Norton
*Assistant Examiner*—Maki A Angadi
(74) *Attorney, Agent, or Firm*—Blake T. Biederman

(57) ABSTRACT

An aqueous solution is useful for selective removal in the presence of a low-k dielectric. The aqueous solution comprises by weight percent 0 to 25 oxidizer; 0.00002 to 5 multi-component surfactant, the multi-component surfactant having a hydrophobic tail, a nonionic hydrophilic portion and an anionic hydrophilic portion, the hydrophobic tail having 6 to 30 carbon atoms and the nonionic hydrophilic portion having 10 to 300 carbon atoms; 0 to 15 inhibitor for a nonferrous metal; 0 to 50 abrasive; 0 to 20 complexing agent for a nonferrous metal; and water.

6 Claims, No Drawings

SELECTIVE SLURRY FOR CHEMICAL MECHANICAL POLISHING

BACKGROUND OF THE INVENTION

This invention relates to polishing of semiconductor wafers and, more particularly, to compositions and methods for removing wafer layers, such as, barrier materials in the presence of another layer, such as a low-k dielectric layer.

Typically, semiconductor substrates have a silicon base and dielectric layers containing multiple trenches arranged to form a pattern of circuit interconnects within the dielectric layer. These trench patterns have either a damascene structure or dual damascene structure. In addition, typically one to as many as three or more capping layers coat the trench patterned dielectric layer with a barrier layer covering the capping layer or capping layers. Finally, a metal layer covers the barrier layer and fills the patterned trenches. The metal layer forms circuit interconnects that connect dielectric regions and form an integrated circuit.

The capping layers can serve different purposes. For example, a capping layer, such as, silicon carbide nitride coating dielectrics, may act as a polishing stop to protect underlying dielectrics from removal during polishing. The silicon carbide nitride's nitrogen concentration varies with manufacturer; and it may contain up to approximately 50 atomic percent nitrogen—if the nitride content is zero, then the stopping layer has a chemistry of silicon carbide. In addition, a silicon dioxide layer, silicon nitride layer or a combination of the two layers, may correct topography above the stopping layer. Typically, a barrier layer, such as a tantalum or tantalum nitride barrier layer, coats the capping layer and a metal conductive layer covers the barrier layer to form the interconnect metal.

Chemical mechanical planarization or CMP processes often include multiple polishing steps. For example, an initial planarization step removes a metal layer from underlying barrier dielectric layers to planarize the wafer. This first-step polishing removes the metal layer, while leaving a smooth planar surface on the wafer with metal-filled trenches that provide circuit interconnects planar to the polished surface. First-step polishing steps tend to remove excess interconnect metals, such as copper, at a relatively high rate. After the first-step polishing, a second-step polishing process typically removes a barrier that remains on the semiconductor wafer. This second-step polishing removes the barrier from its underlying dielectric layer to provide a planar polished surface on the dielectric layer. The second-step polishing may stop on a capping layer, remove all capping layers or remove some of the underlying dielectric layer.

Unfortunately, CMP processes often result in the excess removal of unwanted metal from circuit interconnects or "dishing". This dishing can result from, both first-step polishing and second-step polishing. Dishing in excess of acceptable levels causes dimensional losses in the circuit interconnects. These thin areas in the circuit interconnects attenuate electrical signals and can impair continued fabrication of dual damascene structures. In addition to dishing, the CMP processes often remove excessive amounts of the dielectric layer in an effect known as "erosion". Erosion that occurs adjacent to the interconnect metal can introduce dimensional defects in the circuit interconnects. Furthermore, erosion is a particular problem for low-k and ultra-low-k dielectrics. In a manner similar to dishing, these defects contribute to attenuation of electrical signals and impair subsequent fabrication of dual damascene structures.

After removing the barrier layer and any undesired capping layers, a first capping layer stop, such as a silicon carbide nitride stopping layer, often prevents the CMP process from damaging the dielectric. This stopping layer typically protects the underlying dielectrics to avoid or alleviate dielectric erosion by controlling removal rate. The removal rates of the barrier and other capping layers (such as, silicon nitride and silicon dioxide), versus, a removal rate of the stopping layer are examples of selectivity ratios. For purposes of this application, selectivity ratio refers to the ratio in removal rate as measured in angstroms per minute.

Singh et al., in WO Pat. Pub. No. 03/072670, disclose the optional use of nonionic, anionic, cationic and zwitterionic surfactants to improve selectivity. This patent publication, however, does not disclose a specific formulation useful for limiting low-k dielectric erosion.

There is an unsatisfied demand for a composition that selectively removes barrier materials and capping materials (such as, silicon nitride and silicon dioxide) without removing excessive amounts of dielectric layers, such as low-k dielectric layers. In addition, there is a need for a slurry that polishes semiconductor wafers as follows: removes barrier materials; reduces interconnect dishing, reduces dielectric erosion; avoids peeling of the dielectric; and operates with or without a silicon carbide-nitride stopping layer.

STATEMENT OF THE INVENTION

In one aspect, the invention provides an aqueous solution useful for selective removal in the presence of a low-k dielectric comprising by weight percent 0 to 25 oxidizer; 0.00002 to 5 multi-component surfactant, the multi-component surfactant having a hydrophobic tail, a nonionic hydrophilic portion and an anionic hydrophilic portion, the hydrophobic tail having 6 to 30 carbon atoms and the nonionic hydrophilic portion having 10 to 300 carbon atoms; 0 to 15 inhibitor for a nonferrous metal; 0 to 50 abrasive; 0 to 20 complexing agent for a nonferrous metal; and water.

In another aspect, the invention provides an aqueous solution useful for selective removal in the presence of a low-k dielectric comprising by weight percent 0 to 20 oxidizer; 0.00005 to 2 multi-component surfactant, the multi-component surfactant having a hydrophobic tail, a nonionic hydrophilic portion and an anionic hydrophilic portion, the hydrophobic tail having 8 to 20 carbon atoms and the nonionic hydrophilic portion having 20 to 200 carbon atoms; 0.001 to 15 inhibitor for a nonferrous metal; 0 to 40 abrasive; 0 to 10 complexing agent for a nonferrous metal; and water.

In another aspect, the invention provides a method of removing at least a portion a layer from a semiconductor substrate comprising the step of polishing the semiconductor substrate with a polishing solution, the solution comprising by weight percent 0 to 25 oxidizer; 0.00002 to 5 multi-component surfactant, the multi-component surfactant having a hydrophobic tail, a nonionic hydrophilic portion and an anionic hydrophilic portion, the hydrophobic tail having 6 to 30 carbon atoms and the nonionic hydrophilic portion having 10 to 300 carbon atoms; 0 to 15 inhibitor for a nonferrous metal; 0 to 50 abrasive; 0 to 20 complexing agent for a nonferrous metal; and water.

DETAILED DESCRIPTION

The solution and method provide unexpected selectivity for removing multiple layer materials, such as silicon carbide, silicon carbide nitride, TEOS, tantalum, tantalum nitride and other tantalum-containing materials, while not removing excess low-k materials, such as (silicon) carbon-doped oxide (CDO). The slurry relies upon multi-component surfactants to selectively remove non-low-k layers while stopping on or removing a portion of a low-k layer. This selectivity facilitates reducing dishing of interconnect metal and erosion of low-k dielectric layers. Furthermore, the slurry can remove barrier materials and capping layers such as, silicon nitride, organic caps and dielectrics without peeling or delaminating fragile low-k dielectric layers, such as carbon-doped oxide from semiconductor wafers. Another benefit of these polishing solutions is its ability to stop at carbon-doped oxide layers.

A surface active agent or surfactant, as used in this specification refers to a substance that, when present, has the property of adsorbing onto the wafer substrate's surface or interfaces or alters the surface free energy of the wafer substrate's surface or interfaces. The term "interface" is a boundary between any two immiscible phases. The term "surface" denotes an interface where one phase is gas, usually air. Surfactants usually act to reduce interfacial free energy.

The multi-component surfactants have a molecular structure of a first structural portion that has very little attraction for water known as a hydrophobic tail, a second structural portion that is a nonionic hydrophilic portion having an attraction for water and an anionic hydrophilic group that has a strong attraction for water—the anionic hydrophilic group has a negative ionic charge when it is ionized in a solution.

The hydrophobic groups usually are long chain hydrocarbons, fluorocarbons or siloxane chains that have a length suitable for aqueous solubility. In particular, the hydrophobic groups have a total number of 6 to 30 carbon atoms. Preferably, the hydrophobic group has 8 to 20 carbon atoms and most preferably, it has 12 to 16 carbon atoms. The hydrophobic portion can be either a straight chain, a branched chain or cyclic chain. The hydrophobic portion may be a saturated chain, unsaturated chain or contain an aromatic group. A particular example is straight chain polymers derived from fatty alcohols.

The nonionic hydrophilic portion contains 10 to 300 carbon atoms. Preferably, the nonionic hydrophilic portion contains 20 to 200 carbon atoms. Most preferably, the nonionic hydrophilic portion contains 25 to 150 carbon atoms. The nonionic hydrophilic portion can be either a straight chain, a branched chain or cyclic chain. The nonionic hydrophilic portion may be a saturated chain, unsaturated chain or contain an aromatic group. A particular example of a suitable nonionic hydrophilic portion is a straight chain of polyethylene oxide.

Example anionic portions include anionic portion contains at least one of carboxylic acid, sulfonic acid, sulfuric acid, phosphonic acid and salts thereof or mixtures thereof. The preferred anionic portion contain a chemical group selected from at least one of carboxylate (carboxylic acid salt), sulfonate (sulfonic acid salt), sulfate (sulfuric acid salt), or phosphate (phosphoric and polyphosphoric acid ester). The hydrophilic part of the surfactant may contain one or more nitrogen atoms or one more oxygen atoms or mixture thereof, but it preferably contains at least one of the ionizable groups to provide solubility and repulsive force to negatively charged surfaces, such as silica surfaces.

Typically, high selectivity can be achieved by addition of 0.00002 to 5 wt % of the multi-component surfactant. This specification refers to all concentrations in weight percent, unless specifically referenced otherwise. Furthermore, the disclosed ranges include combining and partially combining ranges and limits within ranges. Preferably, the surfactant is 0.00005 to 2 wt %; and most preferably, the surfactant is 0.0001 to 1 wt %.

Typically, these surfactants are added as ammonium, potassium, quantanary ammonium or sodium salts. Most preferably, the surfactant is added as an ammonium salt for high-purity formulations.

The multi-component surfactant preferably suppresses removal rate of carbon-doped oxide (CDO) (as measured in angstroms per minute) in a greater differential rate than it suppresses removal rate of a barrier film, such as tantalum (Ta) or tantalum nitride (TaN). If we define the relative suppression ($\Delta X$) of removal rate of a film X as $\Delta X = (Xo-X)/Xo$, where Xo and X stand for the removal rates of X film, measured in angstroms per minute, before and after addition of the surfactant, the surfactants disclosed in this invention preferably satisfy at least one of the following equations (using TaN as an example): $\Delta(CDO) > \Delta(TaN)$, as measured with a microporous polyurethane polishing pad pressure measured normal to a wafer of 13.8 kPa (2 psi) and the conditions of the Examples. For example, when polishing at a pressure of 13.8 kPa and the conditions of the Examples with an IC1010™ polishing pad with a surfactant-free composition provides a control polishing rate (Xo) of 500 angstroms per minute for carbon-doped oxide and 500 angstroms per minute for tantalum nitride. Then adding the multi-component surfactant reduces the polishing rates under the same conditions to 300 angstroms per minute for carbon-doped oxide and the removal rate for TaN must be larger than 300 angstroms per minute in order to satisfy the above selectivity equation.

Adjusting pH level and oxidizer concentration facilitate increased barrier removal rates for polishing solutions containing imine and hydrazine derivative compounds. In addition, the solution and method provide unexpected selectivity and control for removing barrier materials. Optionally, the solution relies upon a barrier removal agent selected from the group comprising imine and hydrazine derivative compounds and mixtures thereof to selectively remove barrier materials, such as tantalum-containing and titanium-containing barrier materials. The solution removes barrier materials with reduced dielectric erosion and reduced dishing, erosion and scratching of the metal interconnects, such as copper. Furthermore, the solution removes tantalum barrier materials without peeling or delaminating low-k dielectric layers from semiconductor wafers. In addition, the solution can have a controlled TEOS removal rate for hardmasks formed from silicon dioxide deposited from tetraethylorthosilicate (TEOS) precursors.

In particular, the solution includes a barrier removal agent to remove barrier materials, such as, tantalum, tantalum nitride, tantalum-silicon nitrides and other tantalum-containing barrier materials. Although the solution is effective for titanium-containing barrier materials at acidic pH levels, the solution has particular effectiveness for tantalum-containing materials. For purposes of the specification, tantalum containing materials include tantalum, tantalum-base alloys and tantalum intemetallics, such as tantalum carbides, nitrides and oxides. The slurry is most effective for removing tantalum-containing barriers from patterned semiconductor wafers.

Preferred imine derivatives include compounds of formula (I):

where $R^1$ is —H or —$NH_2$ and R is —H, —$NH_2$, a hydrocarbon group, an amino group, a carbonyl group, an imido group, an azo group, a cyano group, a thio group, or a seleno group and —$OR^7$ where $R^7$ is a hydrocarbon group.

Preferred hydrazine derivatives include compounds of formula (II):

and where $R^3$, $R^4$, $R^5$, and $R^6$ are independently —H, —$OR^7$, —$NH_2$, a hydrocarbon group, a carbonyl group, an imido group, an azo group, a cyano group, a thio group, or a seleno group.

Example imine derivatives include acetamidine, acetamidine salts, acetamidine derivatives, arginine, arginine salts, arginine derivatives, formamidine, formamidine salts, formamidine derivatives, guanidine derivatives, guanidine salts and mixtures thereof. Preferred imine derivatives of formula (I) include, for example, acetamidine hydrochloride, aminoguanidine hydrochloride, arginine, formamidine, formamidinesulfinic acid, formamidine acetate, 1,3-diphenyl guanidine, 1-methyl-3-nitroguanidine, guanidine hydrochloride, tetramethylguanidine, 2,2-azobis (dimethyl-propionamidine)di-HCl, guanidine sulfate, guanidine acetic acid, guanidine carbonate, guanidine nitrate and mixtures thereof.

Preferred hydrazine derivatives of formula (II) include, for example, carbohydrazide, acetic hydrazide, semicarbazide hydrochloride, 1,2-diformylhydrazine, methylhydrazinocarboxylate, oxalic dihydrazide, acetone azine and formic hydrazide and mixtures thereof.

The imine derivative compounds of formula (I) preferably contain an electron-donating substituent as $R^1$ or $R^2$, and are free of electron-withdrawing substituents. More preferably, one of $R^1$ and $R^2$ is an electron-donating substituent, and the other substituent is either hydrogen or an electron-donating substituent. If two electron-donating substituents are present in an imine derivative compound, the substituents may be the same, or they may be different.

Imine derivative compounds of formula (II) preferably contain a hydrazine functionality (>N—$NH_2$) and contain no more than one electron-withdrawing substituent. A hydrazine functionality is provided when $R^3$ and $R^4$ are both hydrogen, or when $R^5$ and $R^6$ are both hydrogen.

For purposes of the specification, the term "electron-donating" refers to a chemical group bonded to a substance that transfers electron density to that substance. F. A. Carey and R. J. Sundberg, in *Advanced Organic Chemistry, Part A. Structure and Mechanisms, 3$^{rd}$ Edition* New York: Plenum Press (1990), p. 208 and 546-561 provide a more detailed description of electron-donating substituents. The imine derivative compounds have an electron-donating substituent that transfers sufficient electron density to the substance to establish a measurable partial negative e charge on the substituent. Electron-donating substituents include, for example, amino, hydroxyl (—OH), alkyl, substituted alkyl, hydrocabon radical, substituted hydrocarbon radical, amido, and aryl. These electron-donating substituents accelerate removal of tantalum-containing barrier materials.

In addition, abrasive additions render imine and hydrazine derivative compounds effective with electron-withdrawing substituents. The term "electron-withdrawing" refers to a chemical group bonded to a substance that transfers electron density away from that substance. Electron-withdrawing substituents transfer sufficient electron density away from the substance to establish a measurable partial positive charge on the substituent and do not accelerate barrier removal. Electron-withdrawing substituents include, for example, —O—alkyl; -halogen; —C(=O)H; —C(=O)-alkyl; —C(=O)OH; —C(=O)-alkyl; —$SO_2$H; —$SO_3$H; and —$NO_2$. The carbonyl groups that are electron-withdrawing are not amide groups.

The tantalum barrier removal agent may be acetamidine, acetamidine salts, acetamidine derivatives, arginine, arginine salts, arginine derivatives, formamidine, formamidine salts, formamidine derivatives, guanidine, guanidine derivatives, guanidine salts and mixtures thereof. These barrier removal agents appear to have a strong affinity for tantalum barrier materials and titanium-containing materials at acidic pH levels. This affinity appears to accelerate the barrier removal rate with limited abrasive or optionally, without the use of any abrasives. This limited use of abrasive allows the polishing to remove the tantalum barrier at a rate greater than the dielectric and the metal interconnect. The solution relies upon a tantalum barrier removal agent selected from the group comprising formamidine, formamidine salts, formamidine derivatives, such as guanidine, guanidine derivatives, guanidine salts and a mixture thereof to selectively remove tantalum battier materials. Particular effective barrier removal agents include guanidine, guanidine hydrochloride, guanidine sulfate, amino-guanidine hydrochloride, guanidine acetic acid, guanidine carbonate, guanidine nitrate, formamidine, formamidinesulfinic acid, formamidine acetate and mixtures thereof. Preferably, the solution contains 0.01 to 12 weight percent barrier removal agent. Most preferably, the solution contains 0.1 to 10 weight percent barrier removal agent and for most applications, barrier removal agent concentrations between 0.1 and 4 weight percent provide sufficient barrier removal rates.

The barrier removal agent provides efficacy in basic, neutral and acidic polishing solutions containing water. Preferably, the solution has a pH of 2 to 12 with a balance water. Preferably, the solution has a basic pH. Typical agents for adjusting pH downward include nitric acid, sulfuric acid, hydrochloric acid, phosphoric acid and organic acids. Most preferably, potassium hydroxide and nitric acid provide final pH adjustments, as required. In addition, the solution most preferably relies upon a balance of deionized water to limit incidental impurities.

At pH levels below 7, an optional oxidizer facilitates barrier removal. The composition contains 0 to 25 weight percent oxidizer. The oxidizer is particularly effective in allowing operation of the slurry at acidic pH levels. Preferably, the solution contains 0 to 20 weight percent oxidizer. Most preferably, the solution contains 0.01 to 5 weight percent oxidizer. The oxidizing agent can be at least one of a number of oxidizing compounds, such as hydrogen peroxide, monopersulfates, iodates, magnesium perphthalate, peracetic acid, persulfates, bromates, perbromates, perchlorates, periodates, ferric nitrate, iron salts, cerium salts, Mn (III) salts, Mn(IV) salts and Mn (VI) salts, silver salts, copper salts, chromium salts, cobalt salts, halogens, hypochlorites and mixtures thereof. Furthermore, it is often preferable to use a mixture of oxidizer compounds. Preferably, the oxidizer is either hydrogen peroxide or iodate. When the polishing slurry contains an unstable oxidizing agent, such as, hydrogen peroxide, it is often most preferable to mix the oxidizer into the slurry at the point of use. The most preferable oxidizer is hydrogen peroxide.

Suitable metals used for the interconnect include, for example, copper, copper alloys, gold, gold alloys, nickel, nickel alloys, platinum group metals, platinum group metal alloys, silver, silver alloys, tungsten, tungsten alloys and mixtures comprising at least one of the foregoing metals. The preferred interconnect metal is copper. In acidic polishing compositions and slurries that utilize oxidizers such as hydrogen peroxide, both the copper removal rate and the static etch rate are high primarily because of oxidation of the copper. In order to reduce the removal rate of the interconnect metal the polishing composition employs a corrosion inhibitor. The corrosion inhibitors function to reduce removal of the interconnect metal. This facilitates improved polishing performance by reducing the dishing of the interconnect metal.

The inhibitor is optionally present in an amount of 0 to 15 wt %—the inhibitor may represent a single or a mixture of inhibitors to the interconnect metal. Within this range, it is desirable to have an amount of inhibitor equal to or greater than 0.001 wt %, preferably greater than or equal to 0.05 wt %. Also desirable within this range is an amount of less than or equal to 4 wt %, preferably less than or equal to 1 wt %. The preferred corrosion inhibitor is benzotriazole (BTA). In one embodiment, the polishing composition may contain a relatively large quantity of BTA inhibitor for reducing the interconnect removal rate. At BTA concentrations above 0.05 wt %, an addition of supplemental corrosion inhibitors may be unnecessary. The preferred concentration of BTA is an amount of 0.0025 to 2 wt %.

In addition to the inhibitor, the solution optionally may contain 0 to 20 weight percent complexing agent for the nonferrous metal. The complexing agent, when present, prevents precipitation of the metal ions formed by dissolving the nonferrous metal interconnects. Most preferably, the solution contains 0 to 10 weight percent complexing agent for the nonferrous interconnect metals. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, glutaric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, salts and mixtures thereof. Preferably, the complexing agent is selected from at least one of acetic acid, citric acid, ethyl acetoacetate, glycolic acid, lactic acid, malic acid, oxalic acid and mixtures thereof. Most preferably, the complexing agent is citric acid.

Although the nitrogen-containing polishing agents provide efficacious abrasive-free polishing fluids, it may be desirable to add an abrasive to the polishing fluid in some applications. The polishing composition may optionally contain up to 50 wt % abrasive (preferably, 0 to 40 wt %) to facilitate barrier removal or combined barrier and silica removal—depending upon the integration scheme, the polishing composition may serve to i) remove the mask layer or film underlying the barrier layer; or ii) to first remove a barrier layer and then remove a silicon oxide-containing layer. The polishing composition optionally includes an abrasive for "mechanical" removal of barrier layers. The abrasive is preferably a colloidal abrasive. Example abrasives include inorganic oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides such as polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is silica.

Preferably, the abrasive is present in an amount of 0.05 to 15 wt %. Within this range, it is desirable to have the abrasive present in an amount of greater than or equal to 0.1 wt %, and preferably greater than or equal to 0.5 wt %. Also desirable within this range is an amount of less than or equal to 10 wt %, and preferably less than or equal to 5 wt %.

The abrasive has an average particle size of less than or equal to 150 nanometers (nm) for preventing excessive metal dishing and dielectric erosion. For purposes of this specification, particle size refers to the average particle size of the abrasive. It is desirable to use a colloidal abrasive having an average particle size of less than or equal to 100 nm, preferably less than or equal to 50 nm. The least dielectric erosion and metal dishing preferably occurs with colloidal silica having an average particle size of less than or equal to 40 nm. Decreasing the size of the colloidal abrasive to less than or equal to 40 nm, tends to improve the selectivity of the polishing composition; but it also tends to decrease the barrier removal rate. In addition, the preferred colloidal abrasive may include additives, such as dispersants, surfactants and buffers to improve the stability of the colloidal abrasive at acidic pH ranges. One such colloidal abrasive is colloidal silica from Clariant S.A., of Puteaux, France. The chemical mechanical planarizing composition can also optionally include brighteners, such as, ammonium chloride, pH buffers, biocides and defoaming agents.

If the polishing composition does not contain abrasives, then pad selection and conditioning become more important to the chemical mechanical planarizing (CMP) process. For example, for some abrasive-free compositions, a fixed abrasive pad improves polishing performance.

The slurry can provide a TaN/CDO selectivity of at least 2 to 1 as measured with a microporous polyurethane polishing pad pressure measured normal to a wafer of less than 13.8 kPa. A particular polishing pad useful for determining selectivity is the microporous polyurethane polishing pad, such as the IC1000™ polishing pad sold by Rohm and Haas Electronic Materials CMP Technologies. Preferably, the slurry provides the selectivity of at least 3 to 1 for TaN/CDO as measured with a microporous polyurethane polishing pad pressure measured normal to a wafer of less than 13.8 kPa; and most preferably, this range is at least 5 to 1 for TaN/CDO. Adjusting the surfactant concentration, slurry pH, oxidizer concentration and tantalum removal agent concentrations adjust the selectivities. Adjusting the inhibitor, oxidizer, complexing agent adjusts the removal rate of the interconnect metals.

EXAMPLES

All the testing was at room temperature and employed 200 mm wafers. Tests employed the following sheet wafers; TEOS $SiO_2$, electroplated copper, CDO® (a carbon doped oxide low-k wafer manufactured by SemiTech), tantalum nitride, tantalum, SiCN and SiN.

Polishing was done on a Strasbaugh 6EC employing IC1010 or Politex® polishing pads manufactured by Rohm and Haas Electronic Materials CMP Technologies. The polishing downforce was 2 psi (13.8 kPa) unless otherwise indicated. A Kinik diamond abrasive conditioning disk ("1508070" 150 micron diamond size, 80 micron protrude height and 70 micron space between diamonds) maintained the polishing pad's surface roughness. Platen and carrier speeds were 120 and 114 rpm, respectively. Slurry flow rate was 200 ml/min. Removal rate was calculated from the film thickness difference before and after polishing divided by the polish time. Thickness measurements for TEOS, CDO®, SiCN and SiN were done with a Therma Wave Optiprobe 2600 and employed 49 mapped points. Tantalum nitride, tantalum and copper thickness measurements were done on a CDE and employed 91 mapped points. All the reported removal rates are in units of Å/min. Polishing time was 60 seconds, but increased to 120 seconds for low removal rate formulations to improve accuracy.

For purposes of this specification, letters represent comparative examples and numbers represent the invention. Table 1 below contains barrier slurry formulations with 0.00005 to 0.01 wt % polyglycol ether sulfate.

TABLE 1

| Slurry | BTA (wt %) | Citric Acid (wt %) | Silica (wt %) | Guanidine Hydrogen Nitrate (wt %) | Biocide (wt %) | pH | Polyglycol Ether Sulfate (wt %) |
|---|---|---|---|---|---|---|---|
| A | 0.1 | 0.5 | 12 | 1 | 0.01 | 9 | 0 |
| 1 | 0.1 | 0.5 | 12 | 1 | 0.01 | 9 | 0.00005 |
| 2 | 0.1 | 0.5 | 12 | 1 | 0.01 | 9 | 0.0001 |
| 3 | 0.1 | 0.5 | 12 | 1 | 0.01 | 9 | 0.0003 |
| 4 | 0.1 | 0.5 | 12 | 1 | 0.01 | 9 | 0.0007 |
| 5 | 0.1 | 0.5 | 12 | 1 | 0.01 | 9 | 0.001 |
| 6 | 0.1 | 0.5 | 12 | 1 | 0.01 | 9 | 0.003 |
| 7 | 0.1 | 0.5 | 12 | 1 | 0.01 | 9 | 0.006 |
| 8 | 0.1 | 0.5 | 12 | 1 | 0.01 | 9 | 0.01 |

BTA = benzotriazole;
Silica was Klebosol II having an average particle size of 50 nm manufactured by AZ Electronic Materials;
Polyglycol Ether Sulfate = Disponil FES 77 IS manufactured by Cognis/Chemicals Group having a nominal composition of $R(EO)_{33}SO_3Na$, where R is a fatty alcohol and EO is ethylene oxide;
Biocide was NEOLONE ™ manufactured by Rohm and Haas Company having 50.0-52.0% methyl-4-isothiazolin-3-one, 45.0-47.0% Propanediol and <3% related reaction product.

Table 2 below provides polishing removal rates in Angstroms per minute for the polishing solutions of Table 1.

TABLE 2

| | 1 psi (6.9 kPa) | | | | | 2 psi (13.8 kPa) | | | | |
|---|---|---|---|---|---|---|---|---|---|---|
| Slurry | CDO | TaN | TEOS | Cu | SiCN | CDO | TaN | TEOS | Cu | SiCN |
| A | 1248 | 930 | 490 | 31 | 806 | 2673 | 1484 | 960 | 61 | 1566 |
| 1 | 763 | 950 | 471 | 46 | 749 | 2329 | 1575 | 1008 | 59 | 1513 |
| 2 | 704 | 944 | 480 | 37 | 822 | 2173 | 1593 | 1001 | 69 | 1616 |
| 3 | 231 | 961 | 459 | 34 | 833 | 720 | 1551 | 1019 | 58 | 1577 |
| 4 | 76 | 928 | 466 | 35 | 561 | 144 | 1586 | 1015 | 56 | 1444 |
| 5 | | | | | | 80 | 1494 | 839 | 42 | |
| 6 | | | | | | 36 | 1524 | 697 | 44 | |
| 7 | | | | | | 20 | 1392 | 657 | 21 | |
| 8 | | | | | | 15 | 1365 | 591 | 41 | |

CDO = CORAL carbon-doped oxide from Novellus.
Example squares indicate not tested Table 2 illustrates that a small amount of polyglycol ether sulfate can have a large impact on the carbon-doped oxide removal rate without a significant impact upon the removal rate of other layer. The anionic portion may serve to repel negative charged silica surfaces to further enhance selectivity and to limit interaction between the surfactant and the abrasive. In addition, the guanidine increased the TaN and SiCN removal rates.

Table 3 below provides a set of guanidine-free slurries for evaluation.

TABLE 3

| Slurry | BTA (wt %) | Biocide (wt %) | Silica (wt %) | pH | Polyglycol Ether Sulfate (wt %) |
|---|---|---|---|---|---|
| 9 | 0.10 | 0.01 | 12.0 | 9 | 0.06 |
| 10 | 0.10 | 0.01 | 12.5 | 9 | 0.06 |
| 11 | 0.10 | 0.01 | 13.0 | 9 | 0.06 |
| 12 | 0.10 | 0.01 | 11.5 | 9 | 0.06 |
| 13 | 0.10 | 0.01 | 11.0 | 9 | 0.06 |
| 14 | 0.10 | 0.01 | 12.0 | 9 | 0.03 |
| 15 | 0.10 | 0.01 | 12.0 | 9 | 0.05 |
| 16 | 0.10 | 0.01 | 12.0 | 9 | 0.07 |

BTA = benzotriazole;
Biocide = Kordek MLX ™ manufactured by Rohm and Haas Company 9.5-9.9% methyl-4-isothiazolin-3-one, 89.1-89.5% water and <1.0% related reaction product;
silica was Klebosol II having an average particle size of 50 nm manufactured by AZ Electronic Materials; and
Polyglycol Ether Sulfate = Disponil FES 77 IS manufactured by Cognis/Chemicals Group having a nominal composition of $R(EO)_{33}SO_3Na$ where R is a fatty alcohol and EO is ethylene oxide.

Table 4 provides removal rates in Angstroms per minute for the solutions of Table 3.

TABLE 4

| Slurry | TaN | TEOS | CDO | SiCN | Cu | SiN | Ta |
|---|---|---|---|---|---|---|---|
| 9 | 1799 | 478 | −12 | 57 | 37 | 278 | 573 |
| 10 | 1795 | 570 | −19 | 66 | 38 | 328 | 582 |
| 11 | 1586 | 720 | −13 | 85 | 167 | 435 | 571 |
| 12 | 1776 | 614 | −9 | 69 | 145 | 349 | 563 |
| 13 | 1773 | 586 | −17 | 73 | 23 | 327 | 556 |
| 14 | 1704 | 710 | −9 | 129 | 14 | 385 | 520 |
| 15 | 1571 | 768 | −9 | 98 | 84 | 416 | 527 |
| 16 | 1616 | 708 | −49 | 84 | 13 | 399 | 510 |

CDO = CORAL carbon-doped oxide from Novellus.

Table 4 illustrates that a small amount of polyglycol ether sulfate can provide an effective stop on carbon-doped oxide layers—the negative numbers for CDO removal rate do not indicate a growing CDO layer, but indicate CDO removal rate below the equipment's detection limit. In addition, the data demonstrate that guanidine is an optional ingredient for the solutions' ability to remove other layers, such as barrier layers.

Table 5 provides removal rates in Angstroms per minute for solutions containing various amounts of silica abrasive with pH adjusted downward with nitric acid.

TABLE 5

| Slurry | BTA (wt %) | Silica (wt %) | pH | PEGS (wt %) | TaN | TEOS | CDO | SiCN | Cu | SiN | Ta |
|---|---|---|---|---|---|---|---|---|---|---|---|
| 17 | 0.1 | 12 | 9 | 0.06 | 1779 | 467 | 9 | 55 | 97 | 258 | 567 |
| 18 | 0.1 | 12 | 7 | 0.06 | 1584 | 400 | 19 | 207 | 29 | 283 | 486 |
| 19 | 0.1 | 12 | 5 | 0.06 | 1116 | 308 | 47 | 809 | 88 | 401 | 261 |
| 20 | 0.1 | 12 | 3 | 0.06 | 1008 | 402 | 100 | 1225 | 96 | 546 | 643 |
| 21 | 0.1 | 8 | 9 | 0.06 | 1766 | 202 | 23 | 25 | 55 | 128 | 135 |
| 22 | 0.1 | 8 | 7 | 0.06 | 1559 | 183 | 32 | 68 | −18 | 135 | 320 |
| 23 | 0.1 | 8 | 5 | 0.06 | 1168 | 140 | 21 | 374 | 9 | 230 | 3 |
| 24 | 0.1 | 8 | 3 | 0.06 | 872 | 178 | 30 | 764 | 116 | 457 | 557 |
| 25 | 0.1 | 4 | 5 | 0.06 | 48 | 59 | −3 | 47 | 85 | 126 | 2 |
| 26 | 0.1 | 4 | 3 | 0.06 | 773 | 111 | −14 | 260 | 65 | 513 | 605 |

All solutions contained 0.01 wt % Kordek MLX™ biocide manufactured by Rohm and Haas Company having 9.5-9.9% methyl-4-isothiazolin-3-one, 89.1-89.5% water and <1.0% related reaction product;
BTA = benzotriazole;
Silica was Klebosol II having an average particle size of 50 nm manufactured by AZ Electronic Materials;
PEGS (Polyglycol Ether Sulfate) = Disponil FES 77 IS manufactured by Cognis/Chemicals Group having a nominal composition of $R(EO)_{33}SO_3Na$, where R is a fatty alcohol and
EO is ethylene oxide; and
CDO = CORAL carbon-doped oxide from Novellus.

Table 5 illustrates that although polyglycol ether sulfate loses some effectiveness with a decrease in pH level, the solution is effective at decreasing carbon-doped oxide removal rates in both basic and acidic solutions. In addition, the polyglycol ether sulfate is effective with both low and high concentrations of silica particles.

In addition, the solution and method optionally provide excellent selectivity for removing tantalum barrier materials such as tantalum, tantalum nitride and tantalum oxide and capping layers such as, silicon nitride and silicon oxide while stopping at the carbon-doped oxide layer. In addition, the solution selectively removes barrier layers, capping layers, dielectric layers, anti-reflective layers and hard masks to reduce or eliminate dielectric erosion.

The invention claimed is:

1. An aqueous solution useful for selective barrier removal in the presence of a low-k dielectric comprising by weight percent 0 to 25 oxidizer; 0.00002 to 5 multi-component surfactant, the multi-component surfactant consisting of a hydrophobic tail, a nonionic hydrophilic portion and an anionic hydrophilic portion, the anionic hydrophilic portion consists of carboxylic acid, sulfonic acid, sulfuric acid and salts thereof or mixtures thereof, the hydrophobic tail having 6 to 30 carbon atoms and the nonionic hydrophilic portion being a straight chain of polyethylene oxide having 20 to 200 carbon atoms; 0.1 to 10 weight percent barrier removal agent selected from at least one of formamidine, formamidine salts, formamidine derivatives, guanidine, guanidine derivatives, guanidine salts and a mixture thereof; 0 to 15 inhibitor for a nonferrous metal; 0 to 50 abrasive; 0 to 20 complexing agent for a nonferrous metal; and water; and the aqueous solution having a TaN/CDO removal rate selectivity of at least 2 to 1 as measured with a microporous polyurethane polishing pad pressure measured normal to a wafer of less than 13.8 kPa.

2. The solution of claim 1 wherein the multi-component surfactant has the structure $R(EO)_{33}SO_3Na$, where R is a fatty alcohol and EO is ethylene oxide.

3. An aqueous solution useful for selective barrier removal in the presence of a low-k dielectric comprising by weight percent 0 to 20 oxidizer; 0.00005 to 2 multi-component surfactant, the multi-component surfactant consisting of a hydrophobic tail, a nonionic hydrophilic portion and an anionic hydrophilic portion, the anionic hydrophilic portion consists of carboxylic acid, sulfonic acid, sulfuric acid and salts thereof or mixtures thereof, the hydrophobic tail having 8 to 20 carbon atoms and the nonionic hydrophilic portion being a straight chain of polyethylene oxide having 20 to 200 carbon atoms; 0.1 to 1.0 weight percent barrier removal agent selected from at least one of formamidine, formamidine salts, formamidine derivatives, guanidine, guanidine derivatives, guanidine salts and a mixture thereof; 0.001 to 15 inhibitor for a nonferrous metal; 0 to 40 abrasive; 0 to 10 complexing agent for a nonferrous metal; and water, and the aqueous solution having a TaN/CDO removal rate selectivity of at least 2 to 1 as measured with a microporous polyurethane polishing pad pressure measured normal to a wafer of less than 13.8 kPa.

4. The solution of claim 3 wherein the multi-component surfactant has the structure $R(EO)_{33}SO_3Na$, where R is a fatty alcohol and EO is ethylene oxide.

5. The solution of claim 3 wherein the solution includes 0.1 to 4 weight percent barrier removal agent of at least one selected from guanidine, guanidine hydrochloride, guanidine sulfate, amino-guanidine hydrochloride, guanidine acetic acid, guanidine carbonate, guanidine nitrate, formamidine, formamidinesulfinic acid, formamidine acetate and mixtures thereof.

6. The solution of claim 3 wherein the hydrophobic tail contains 12 to 16 carbon atoms and the nonionic hydrophilic portion contains 25 to 150 carbon atoms.

* * * * *